United States Patent
Huang et al.

(10) Patent No.: US 7,657,850 B2
(45) Date of Patent: Feb. 2, 2010

(54) CHIP LEVEL SCAN CHAIN PLANNING FOR HIERARCHICAL DESIGN FLOWS

(75) Inventors: Lin Huang, San Jose, CA (US); Huaming Hu, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 143 days.

(21) Appl. No.: 11/638,292

(22) Filed: Dec. 12, 2006

(65) Prior Publication Data

US 2008/0141086 A1    Jun. 12, 2008

(51) Int. Cl.
   *G06F 17/50* (2006.01)
(52) U.S. Cl. .......................... 716/4; 714/726
(58) Field of Classification Search .............. 716/4, 716/7, 8–11; 714/724–729
   See application file for complete search history.

(56) References Cited

U.S. PATENT DOCUMENTS

| | | | | |
|---|---|---|---|---|
| 5,949,692 A * | 9/1999 | Beausang et al. | ............. | 716/18 |
| 6,405,355 B1 * | 6/2002 | Duggirala et al. | ............... | 716/8 |
| 6,496,966 B1 * | 12/2002 | Barney et al. | .................. | 716/10 |
| 6,564,362 B2 * | 5/2003 | Osaki et al. | .................... | 716/10 |
| 6,681,356 B1 * | 1/2004 | Gerowitz et al. | ............. | 714/729 |
| 7,032,202 B2 * | 4/2006 | Guettaf et al. | .............. | 714/729 |
| 2004/0098687 A1 * | 5/2004 | Guettaf et al. | ................. | 716/7 |
| 2007/0260949 A1 * | 11/2007 | Fredrickson et al. | ........ | 714/726 |

* cited by examiner

*Primary Examiner*—Paul Dinh
*Assistant Examiner*—Nha T Nguyen
(74) *Attorney, Agent, or Firm*—Silicon Valley Patent Group, LLP; Edward S. Mao

(57) ABSTRACT

A scan chain planning method uses physical data with a hierarchical design to optimize chip level scan chains. Specifically, location data of physical blocks is used to determine optimal partitioning of the hierarchical design to balance chip level scan chains and reduce the number block scan ports by determining optimal locations for the block scan ports. Actual layout of the scan chains is based on the locations of the block scan ports and the number of scan elements determined by the method for each block scan chain.

12 Claims, 8 Drawing Sheets

CHIP LEVEL SCAN CHAIN PLANNING FOR HIERARCHICAL DESIGN FLOWS

BACKGROUND

1. Field of the Invention

The invention relates to design of semiconductor chips. More specifically, the invention relates to a method and an apparatus for scan chain planning in an integrated circuit.

2. Related Art

As the complexity of integrated circuits has increased, chip designers have increasingly become dependent on EDA tools (electronic design automation). In addition EDA tools have increasingly added features for testing the integrated circuits. In addition to testing the design of the integrated circuits, most EDA tools also support design for testability (DFT), which allows testing of a manufactured integrated circuit.

The most common design for testability feature is the inclusion of one or more scan chains in an integrated circuit. Scan chains are formed by tying scan elements, such as internal registers, flip-flops, and other storage elements, in series. The scan chains are then tied to external chip pins vial bonding pads. The elements in the scan chain have two functional modes. In the "mission mode", the elements in the scan chain perform the intended logic functions of the integrated circuit. In the "test mode", the elements of the scan chain are configured to serially receive data or to serially output the current state of the elements in the scan chain. For example, test vectors can be scanned into the scan chain, then the integrated circuit is allowed to function as intended for one or more clock cycles. Then the data from the scanned chain is read to determine whether the integrated circuit performed correctly.

As processing technology improved, the number of transistors on a single integrated circuits has increased drastically. To make use of the large number of available transistors, designers now use hierarchical design methodologies. Generally, a complex design is broken down into various layers of logic blocks. The logic blocks can be designed independently and can even be shared between different designs. The logic blocks are converted into physical blocks that are positioned in a floor plan for the integrated circuit. For example, FIG. 1 illustrates an integrated circuit design 100 with physical blocks 110, 120, 130, 140, 150, and 160. Integrated circuit design 100 would also include various glue logic (not shown) that couples the physical blocks together.

Conventionally, the various physical blocks have one or more block scan chains. For clarity, scan elements within a physical block can be referred to as a block scan element and scan elements not within a physical block can be referred to as a non-block scan element. Each block scan chain has an scan input port and a scan output port on the physical block to allow the internal block scan chains to be connected to non-block scan elements and other internal block scan chains to form one or more chip level scan chains. The number of chip level scan chains is usually selected by the chip designer based on various factors such as the number of scan elements on the chip, the number of available pins (and bonding pads) for scan chains, and the desired length of scan chains. However, the formation of the chip level scan chains is severely limited by the block scan chains both in terms of the scan input port and scan output port locations and the size of the block scan chains. Therefore, the chip level scan chains are likely to be sub-optimal even if the block scan chains are optimized. For example, the chip scan chains may be unbalanced both in terms of physical length and the number of scan elements. Hence there is a need or a method and apparatus for forming optimized chip level scan chains in hierarchical design.

SUMMARY

Accordingly, the present invention provides balanced chip level scan chains in hierarchical designs. Specifically, methods in accordance with the present invention make use of physical block information in the formation of block scan chains and placement of scan input ports and scan output ports to provide balanced chip level scan chains.

In one embodiment of the present invention, the scan elements are collected from the hierarchical integrated circuit design. Physical block locations are determined prior to determining the locations of block scan ports for each of the physical blocks. The elements of the physical blocks are placed in part based on the locations determined for the block scan ports. Specifically, the hierarchical integrated circuit design is partitioned based on the number of scan chains and the size of the scan chains. Physical blocks are placed within the partitions and may be split between multiple partitions.

The partitions are tiled based on the borders of the physical blocks to form block tiles and non block tiles. The block tiles are derived from physical blocks and the non block tiles encompass areas generally used for glue logic. The scan chain is pathed through the tiles. To minimize block scan ports, the scan chain path only enters and exits each tile once.

The present invention will be more fully understood in view of the following description and drawings.

DETAILED DESCRIPTION

Figure 2:
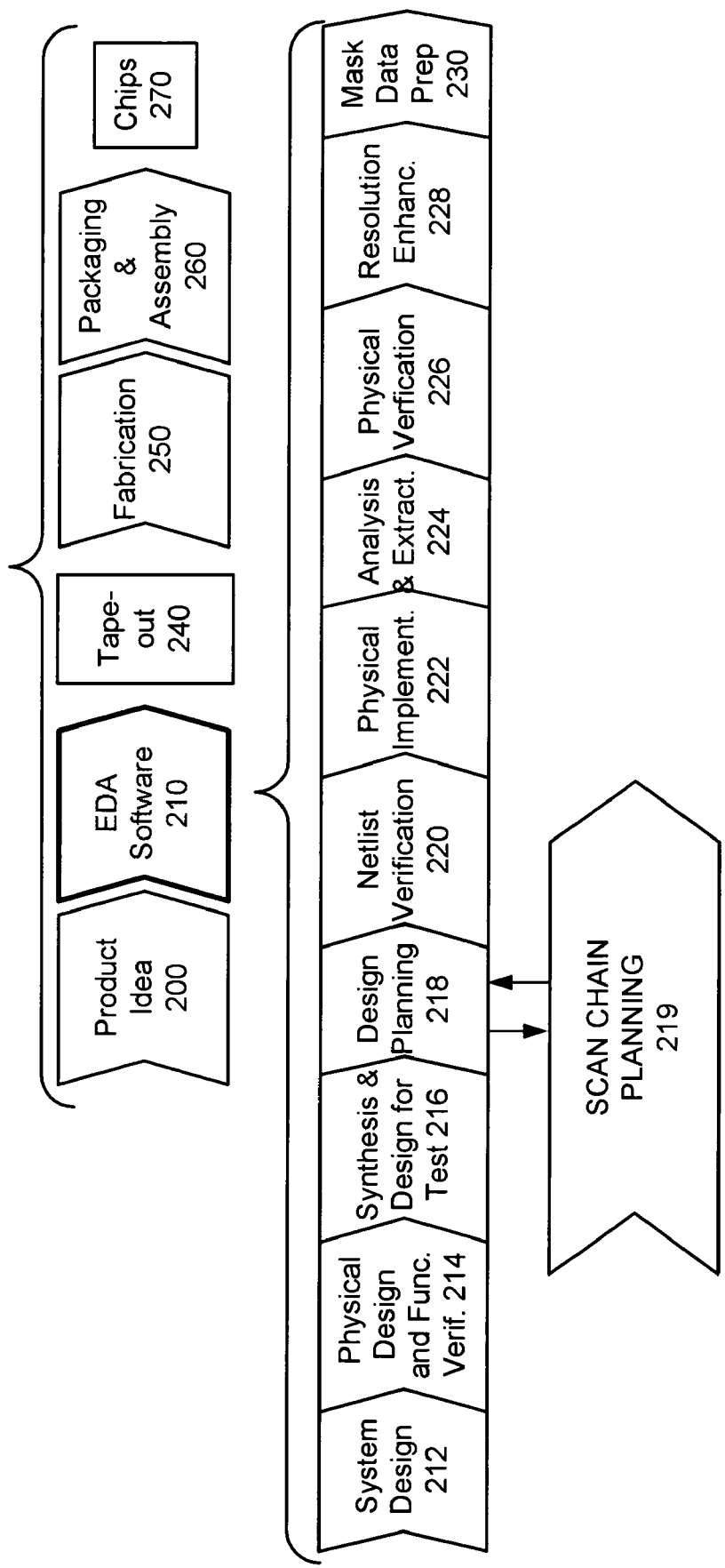
FIG. 2 is a simplified representation of an exemplary digital ASIC design flow in accordance with one embodiment of the present invention.

It may be helpful to place the processes of this invention in context of the overall chip design. FIG. 2 shows a simplified representation of an exemplary digital IC design flow. At a high level, the process starts with the product idea (200) and is realized in a EDA software design process (210). When the design is finalized, it can be taped-out (event 240). After tape out, the fabrication process (250) and packaging and assembly processes (260) occur resulting, ultimately, in finished chips (result 270).

The EDA software design process (210) is actually composed of a number of stages 212-230, shown in linear fashion for simplicity. In an actual IC design process, the particular design might have to go back through steps until certain tests are passed. Similarly, in any actual design process, these steps may occur in different orders and combinations. This description is therefore provided by way of context and general explanation rather than as a specific, or recommended, design flow for a particular IC. A brief description of the components of the EDA software design process (stage 210) will now be provided.

System design (stage 212): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 214): At this stage, the VHDL or Verilog code for modules in the system is written and the design (which may be of mixed clock domains) is checked for functional accuracy. More specifically, the design is checked to ensure the design produces the correct outputs. Exemplary EDA software products from Synopsys, Inc. that can be used at this stage include VCS, VERA, DesignWare®, Magellan, Formality, ESP and LEDA products.

Synthesis and design for test (stage 216): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 218): Here, an overall floorplan for the chip is constructed and analyzed for timing and top-level routing. Exemplary EDA software products from Synopsys, Inc. that can be used at this stage include Jupiter and Flooplan Compiler products. Although circuitry and portions thereof (such as standard cells) are described herein as if they exist in the real world, it is to be understood that at this stage only a computer model exists in a programmed computer. The actual circuitry in the real world is created after this stage. In accordance with the present invention, Scan chain planning 219 as described in detail below, occurs during design planning so that information regarding the location and size of the physical blocks can be incorporated into scan chain planning.

Netlist verification (stage 220): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 222): The placement (positioning of circuit elements) and routing (connection of the same) occurs at this step. Exemplary EDA software products from Synopsys, Inc. that can be used at this stage include the Astro product.

Analysis and extraction (stage 224): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 226): At this stage various checking functions are performed to ensure correctness for: manufacturing, electrical issues, lithographic issues, and circuitry. Exemplary EDA software products from Synopsys, Inc. that can be used at this include the Hercules product.

Resolution enhancement (stage 228): This stage involves geometric manipulations of the layout to improve manufacturability of the design. Exemplary EDA software products from Synopsys, Inc. that can be used at this include iN-Phase, Proteus, and AFGen products.

Mask data preparation (stage 230): This stage provides the "tape-out" data for production of masks for lithographic use to produce finished chips. Exemplary EDA software products from Synopsys, Inc. that can be used at this stage include the CATS(R) family of products.

Figure 3:
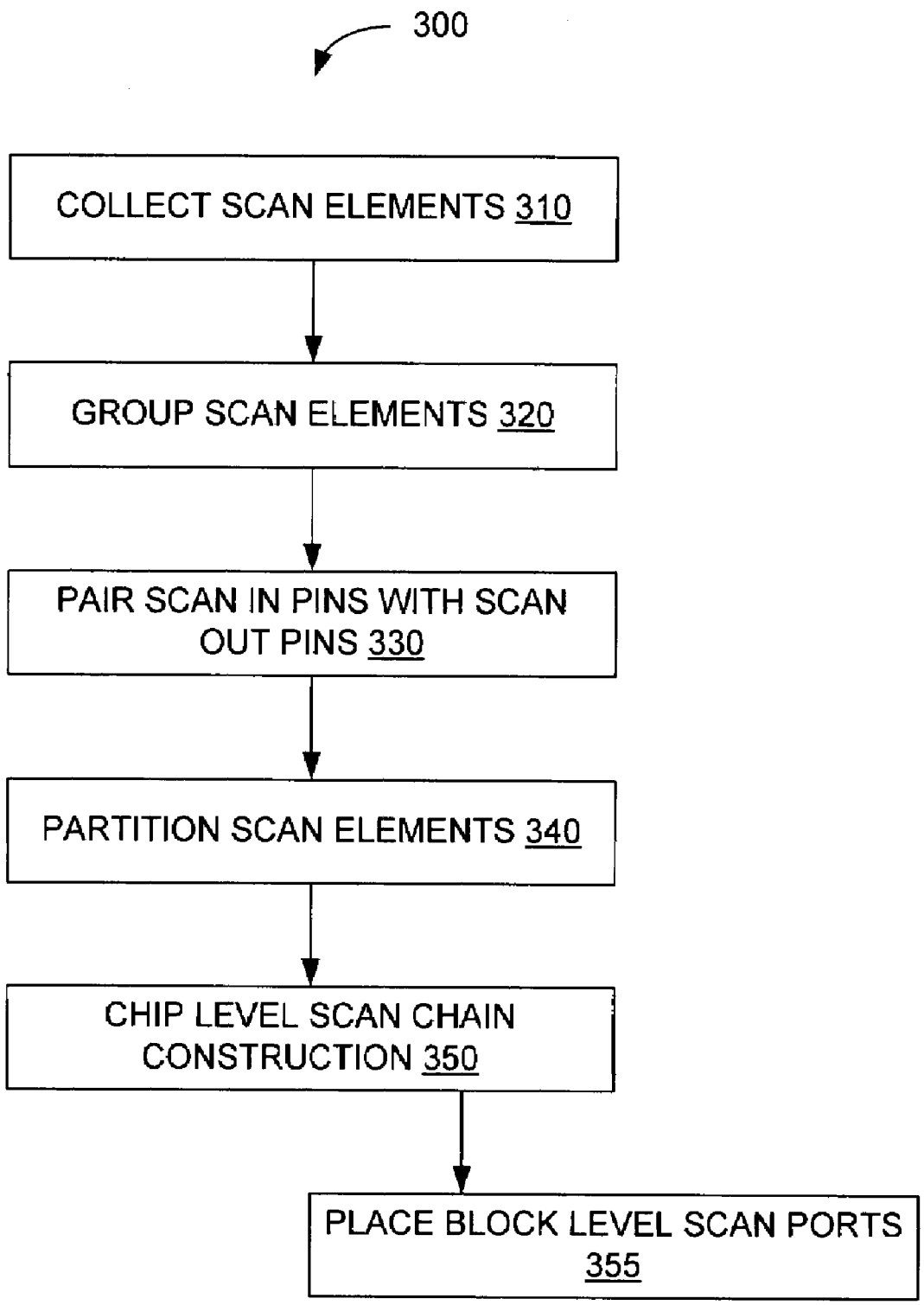
FIG. 3 is a flow chart of one embodiment of the present invention.

FIG. 3 is a flow chart 300 illustrating scan chain planning (219 in FIG. 2) in accordance with one embodiment of the present invention. As explained above, prior to scan chain planning, the location and size of the various physicals of the integrated circuit has been determined in Design Planning 218. Furthermore, the IC designers can select options for scan chain planning such as, the number of chip level scan chains, orientation of the chip level scan chains (generally vertical or horizontal), input/output pins for scan functions, and clock groupings. Rather than a specific number of chip level scan chains, many embodiments of the present invention allow various parameters to be set, which are then used to calculate the number of chip level scan chains. For example, in one embodiment of the present invention, an IC designer can define a maximum chip level scan chain length rather than the specific number of chip level scan chains. The number of chip level scan chains is then calculated by dividing the total number of scan elements by the maximum chip level scan chain length. Clock grouping is only necessary for integrated circuits having multiple clock domains. In general clock grouping can be selected as no mixing, mix edges only, mix clocks not edges, or mix clocks and edges. The most common setting is no mixing, in which all elements on a scan chain are clocked by the same edge (i.e., rising edge or falling edge) of the same clock signal. In mix edges only, all elements on a scan chain are clocked on by the same clock signal but can use different clock edges of the same clock signal. In mix clocks not edges, elements on a scan change can be clocked by different clock signals but use the same clock edge. In mix clocks and edges, the elements on a scan change can use any clock signal and any clock edge. Clock grouping is also used in conventional scan chain construction and is therefore not an integral part of the present invention. The present invention can incorporate any clock grouping method.

In COLLECT SCAN ELEMENTS 310, the IC design is parsed to locate all elements that can be made into scan elements. Then in GROUP SCAN ELEMENTS 320, the scan elements are separated into group based on the clock grouping parameters set by the IC designer. In general, each group of scan elements is processed separately. A certain number of chip level scan chains is assigned to each group based on the number of scan elements in each group.

In PAIR SCAN IN PINS WITH SCAN OUT PINS 330, scan in pins and scan out pins for the chip level scan chains are paired together. Specifically, each chip level scan chain uses a scan in pin and a scan out pin. Generally, the IC designer provides a set of scan in pins and a set of scan out pins. Pairs of scan in pins and scan out pins are selected to minimize the overlapping of any two scan chain partitions (as explained below). First, scan in pins and scan out pins are sorted along the chip boundary. Generally, the scan in pins are on one side of the chip and the scan out pins are on the opposite side. One scan in pin will be paired with a scan out pin that is most aligned with the scan in pin. This pairing process will continue until all scan pins are paired. If no scan in pins and scan out pins are selected by the designer, PAIR SCAN IN PINS WITH SCAN OUT PINS 330 can be skipped. In these situations scan in pins and scan out pin locations are selected at the optimum locations on the chip boundary for each scan partition to minimize the length of the chip level scan chains.

In PARTITION SCAN ELEMENTS 340, the scan elements are partitioned for individual scan chains. Partitioning in accordance with the present invention is described in detail below and shown in FIGS. 4, FIG. 5(*a*)-(*d*), and 6. In CHIP LEVEL SCAN CHAIN CONSTRUCTION 350, a chip level scan chain is constructed for each partition. As part of the chip level scan chain construction optimal locations are determined for the block level scan ports in PLACE BLOCK LEVEL SCAN PORTS 355, which is used to construct block scan chains within the physical blocks. Chip level scan chain construction is described in detail below and shown in FIGS. 5(*d*) and 7.

Because the actual layout (i.e. the placement of the logic elements) is not determined until physical implementation stage 222 (FIG. 2). Many embodiments of the present invention, allow scan chain reordering and even swapping of scan elements between block scan chains within a physical block. For these embodiments, scan chain planning 219 dictates the location of the block level scan ports and the number of scan elements in each block scan chain.

Figure 1:
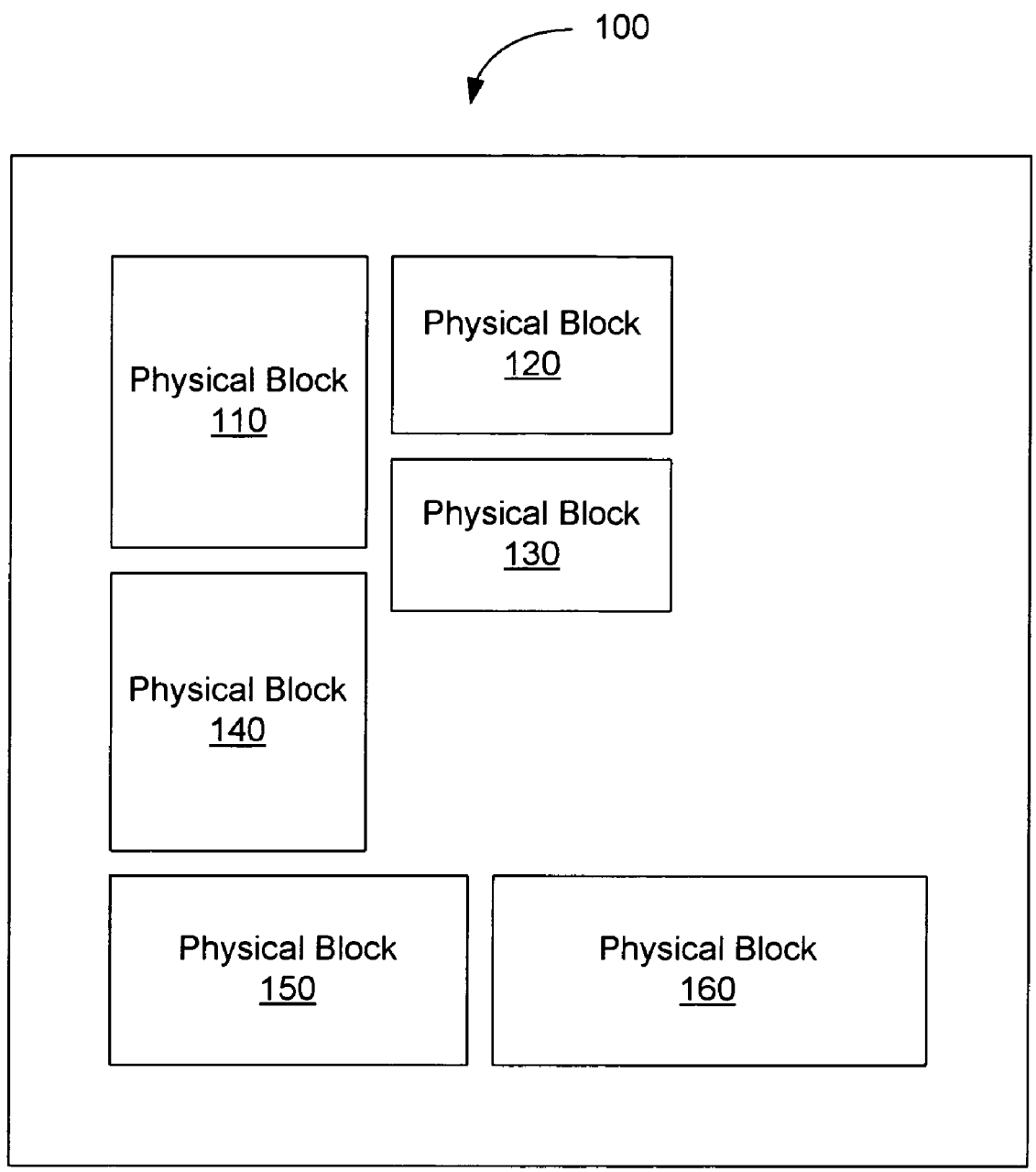
FIG. 1 is a simplified block diagram an integrated circuit design using various physical blocks.
Figure 4:
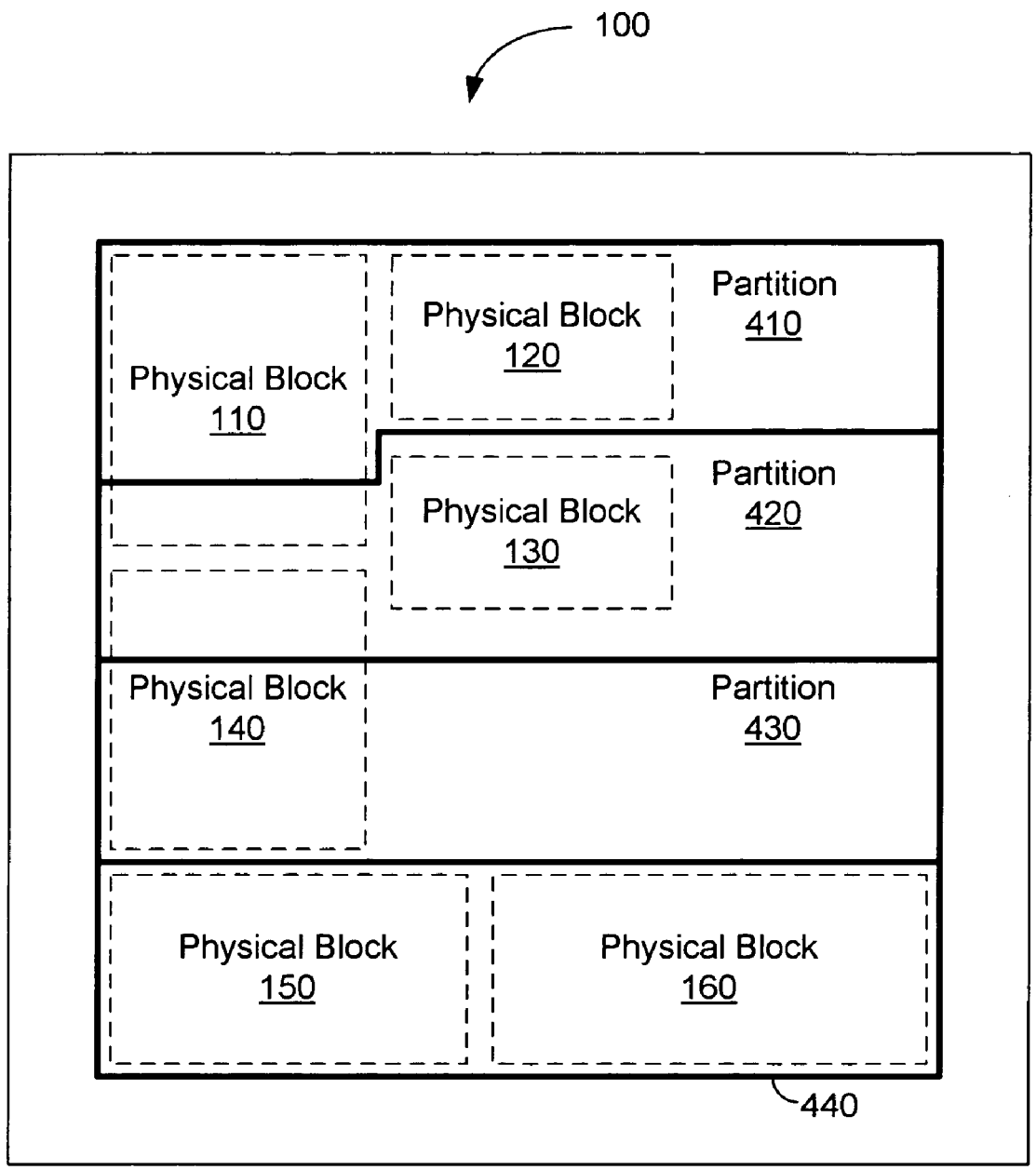
FIG. 4 illustrates partitioning of an integrated circuit design in accordance with one embodiment of the present invention.

FIG. 4. illustrates partitioning in accordance with one embodiment of the present invention using integrated circuit design 100 from FIG. 1. In FIG. 4, partitions are outlined with thick solid lines and physical blocks are shown with dashed lines. Generally, chip level scan chains should be balanced in terms of the number of scan elements in each chip level scan chain. Therefore, partitioning is based on the number of scan elements more so than the area of the IC. However, some area constraints can be placed on the partition to minimize scan chain length. In general partitions are roughly rectangular and extend from one side of the integrated circuit to the opposite side. However, many embodiments of the present invention can use different base shapes.

As shown in FIG. 4, integrated circuit design 100 is partitioned into 4 partitions (410, 420, 430 and 440). During partitioning a physical block can be (1) included in the partition, (2) split, so only part of the physical block is included in the partition, or (3) omitted from the partition. The decision to include, split or omit a physical block is made based on the objective to minimize the number of block level scan ports (and block scan chains). Thus, in general splitting a physical block should be avoided when possible. However, in many situations a physical block should be split. For example if the number of scan elements in a physical block is greater than the maximum size of a chip level scan chain, the physical block should be split. In other situations, splitting one physical block may prevent splitting two or more physical blocks. Thus, in one embodiment of the present invention, physical block decision are made to include as many physical blocks as possible in each partition while minimizing split physical blocks.

In a specific embodiment of the present invention, a two pass process is used to determine the assignment of the physical block to partitions. Scan elements of the design are sorted along the partition direction to form lines and then the lines are sorted perpendicular to the partition direction. Thus for example in FIG. 4 the partitions are horizontal. Thus the scan elements are sorted into rows and the rows are sorted from top to bottom. Thus, the scan elements would be read like the letters on a page (i.e. from left to right on each row and from top to bottom row by row). Alternatively, the directions could be reversed e.g. right to left on each row, bottom to top row by row; left to right on each row, top to bottom row by row; or right to left on each row, top to bottom row by row. Similarly, vertical partitions could also be used and the scan elements can be arranged by columns.

In the first ("trial") pass, scan elements are taken in order from the sorted list and assigned to the first partition. Non-block scan elements (i.e. scan elements that are not a part of any physical block) are added to the first partition individually. However when a block scan element (i.e. a scan element that is a part of a physical block) is added to the first partition, the entire physical block is added to the first partition if possible. However, if there are too many scan elements in the physical block, the physical block is marked as a split physical block. Scan elements in split physical blocks are treated like non-block scan elements and added to a partition individually. Additional partitions are formed in the same way. However starting with the second partition an additional check is made to determine if any physical blocks that were completely included in the previous partition would completely overlap the current partition. If such a physical block exists, that physical block is marked as a split physical block. After the first "trial" pass finishes for all partitions. The final ("real") pass is performed using the same algorithm but including the split physical block markers generated from the first "trial" pass.

Specifically, in FIG. 4, partition 410 includes part of physical block 110, all of physical block 120, and omits physical block 130. Partition 420 includes the rest of physical block 110, all of physical block 130, and part of physical block 140. Partition 430 includes the rest of physical block 140. Partition 440 includes all of physical block 150 and 160.

After forming the partitions, the partitions are cut into tiles. Tile boundaries are based on block boundaries. FIGS. 5(*a*)-5(*c*) illustrate the tiling process for partition 420 in accordance with one embodiment of the present invention. In FIG. 5(*a*), partition cuts 512, 518, 522, and 528 are made along the block borders that are perpendicular to the partition. For clarity, the portion of physical block 110 in partition 420 is referred to as physical block 110B (the portion in partition 410 would be referred to as physical block 110A). Similarly, the portion of physical block 140 in partition 420 is referred to as physical block 140A. Partition cut 512 is made along the left vertical border of physical blocks 110B and 140A, which happen to be horizontally aligned. Partition cut 518 is made along the right vertical border of physical blocks 110B and 140A. Similarly, partition cuts 522 and 528 are made along the left and right vertical borders of physical block 130, respectively. Tiles are defined by the borders of physical blocks and partition cuts. Thus, physical blocks in a partition and the portions of physical blocks in a partition become tiles. Other areas enclosed by the borders and partition cuts also become tiles. For clarity, tiles derived from physical blocks are called block tiles in the description and tiles derived from areas outside the physical blocks are called non-block tiles. However due to space limitations in the figures, both block tiles and non-block tiles are labeled as "Tile" in the figures.

As shown in FIG. 5(*b*), block tiles T110B, T140A, and T130 are derived from physical blocks 110B, 140A, and 130, respectively. Non-block tile 420-1 is defined in the area between block tiles T110B and T140A and partition cuts 512 and 518. Non-block tile 420-2 is defined in the area between partition cuts 518 and 522. Non-block tile 420-3 is defined in the area beneath block tile T130 and in between partition cuts 522 and 528. Non-block tile 420-4 is defined in the area to the right of partition cut 528. Each non-block tile is examined to determine whether any scan elements exist in the non-block tile. If a non-block tile does not contain a scan element, the non-block tile is removed. For example, as shown in FIG. 5(*c*), non-block tiles 420-1 and 420-2 are removed due to not having any scan elements.

Figure 5A:
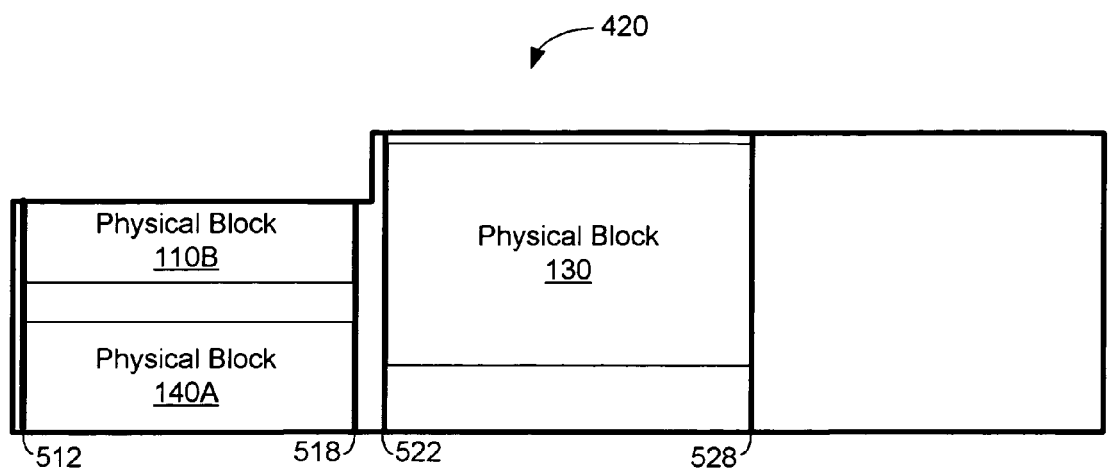
FIG. 5(*a*)-5(*d*) illustrate tiling and scan chain formation in accordance with one embodiment of the present invention.
Figure 5B:
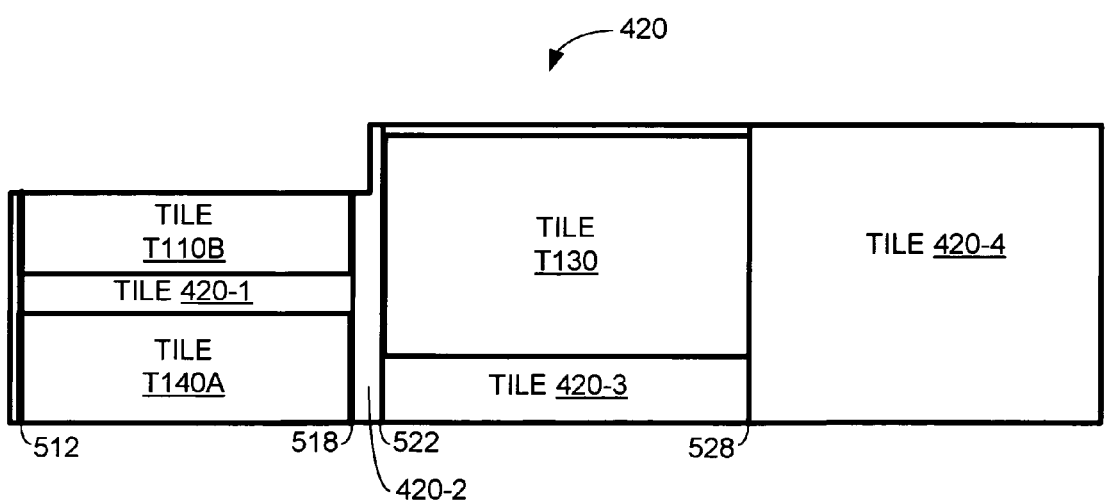
Figure 5C:
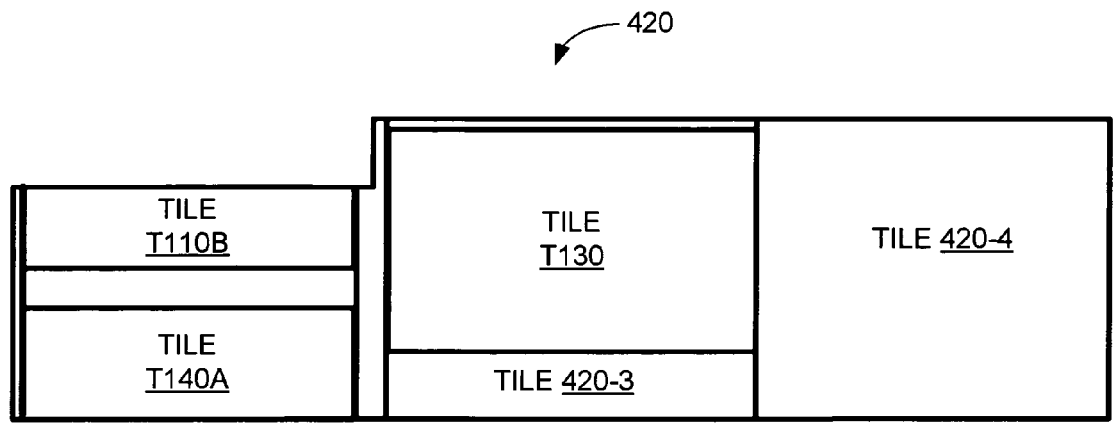
Figure 5D:
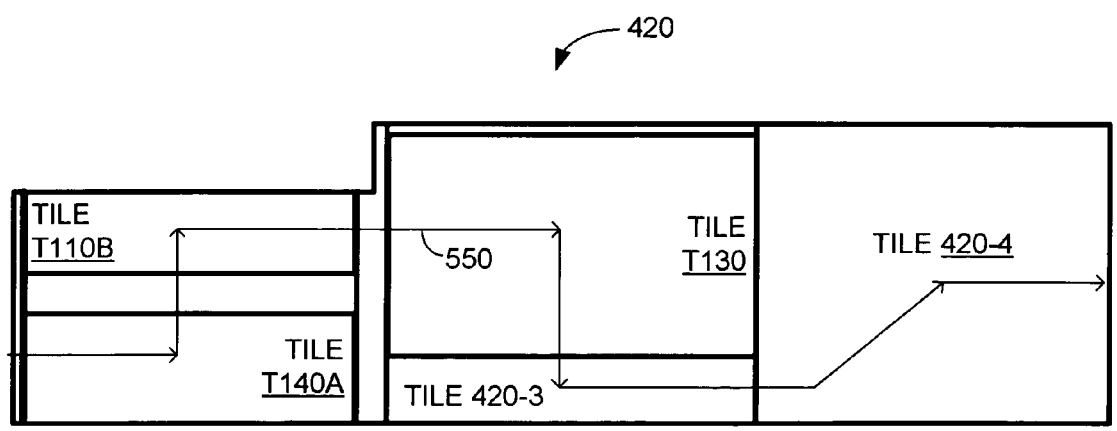

A pathing algorithm is used to determine a scan chain path that traverses for the remaining tiles. The pathing algorithm should seek to minimize entry and exits in each tile as well as minimizing the overall length of the scan chain. In most situations each tile will be entered and exited only one time. Conventional pathing algorithms, such as graph path algorithm, Eular path algorithm, or the traveling salesman algorithm can be used. In most of these algorithms, adjacencies of the tiles are used to determine the path. In FIG. 5(c), block tile T110B is adjacent to block tile T140A and block tile T130. Block tile T140A is adjacent to block tile T110B, block tile T130, and non-block tile 420-3. Block tile T130 is adjacent to block tile T110B, block tile T140A, non-block tile 420-3, and non-block tile 420-4. Non-block tile 420-3 is adjacent to block tile T140A, block tile T130, and non-block tile 420-4. Non-block tile 420-4 is adjacent to block tile T130 and non-block tile 420-3. FIG. 5(d) shows a possible scan chain path 550. Many other scan chain paths are also possible. A scan chain path is used to illustrate the general direction of the scan chain. Actual scan chains would likely follow a very crooked path and cover most of the area in each partition. Specifically in FIG. 5(d) scan chain path 550 enters block tile T140A though the left border of block tile T140A and exits block tile T140A through the top of block tile T140A to enter block tile T110B through the bottom border of block tile T110B. Scan chain path 550 then exits block tile 110B through the right border of block tile T110B and enters block tile T130 through the left border of block tile T130. Next, Scan chain path 550 exits block tile T130 through the bottom border of block tile T130 to enter non-block tile T420-3 through the top border of non-block tile T420-3. Scan chain 550 then exits non-block tile T420_3 through the right border of non-block tile T420-3 and enters non-block tile T4204 through the left border of non-block tile T4204. Finally, scan chain 550 exits non-block tile T420-4 through the right border of non-block tile T420-4.

Figure 6:
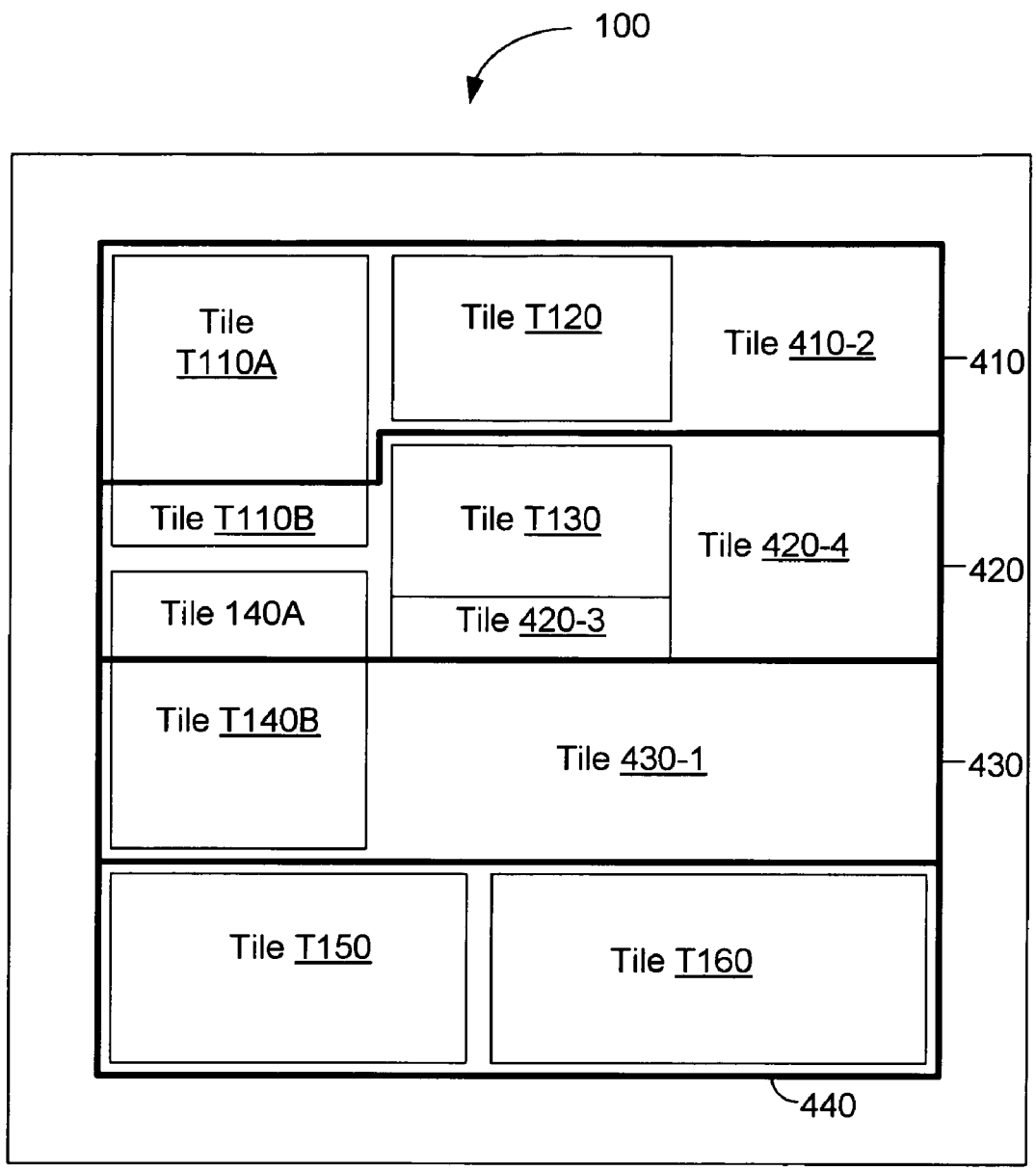
FIG. 6 illustrates tiling in accordance with one embodiment of the present invention.

FIG. 6 shows the various tiles in partitions 410-440 as derived in the method described above. Partition 410 includes block tile T110A (derived from the part of physical block 110 in partition 410), block tile T120 (derived from physical block 120), and a non-block tile 410-2. Partition 420 is described above with respect to FIG. 5(c). Partition 430 includes block tile T140B (derived from the part of physical block 140 in partition 420) and non-block tile 430-1. Partition 440 includes block tile T150 (derived from physical block 150) and block tile T160 (derived from physical block 160).

Figure 7:
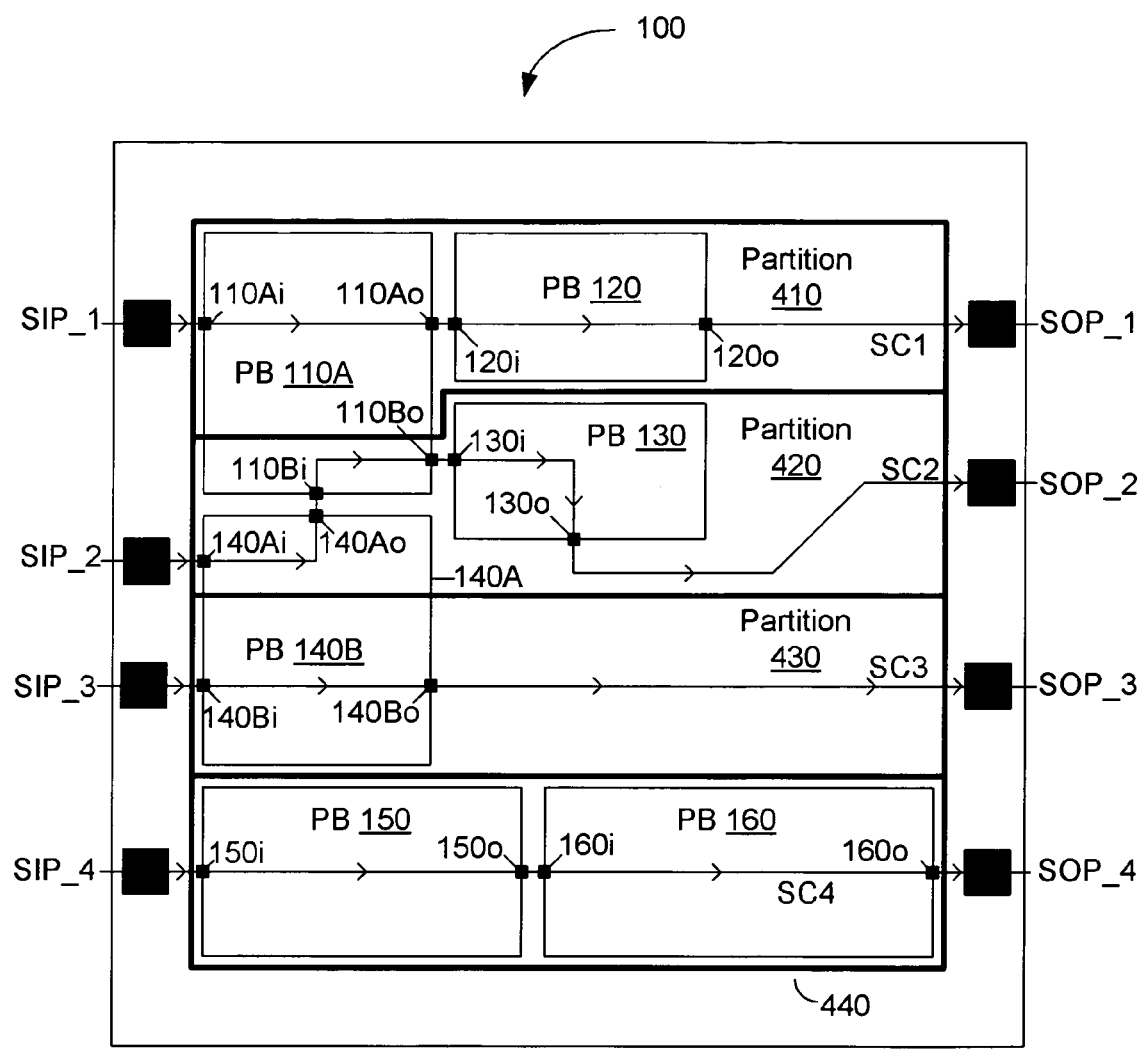
FIG. 7 illustrates scan chain formation in accordance with one embodiment of the present invention.

As explained above, during chip level scan chain construction, each scan elements within the partition are tied together serially. However, each tile should only be entered and exited once to minimize the number of block scan ports and to help optimize block scan chains within the tiles. FIG. 7 illustrates the general direction of scan chains SC1, SC2, SC3 and SC4 for partitions 410, 420, 430, and 440, respectively and the block scan ports on the physical blocks. Because block scan ports are being illustrated, FIG. 7 shows physical blocks rather than tiles. As noted above, actual scan chains would likely follow a very crooked path and cover most of the area in each partition. Scan Chain SC1 begins at scan input pad SIP_1 and enters physical block 110A at block scan input port 110Ai. (Due to space constraints, physical block is abbreviated as PB in FIG. 7). After traversing the scan elements of physical block 110A, scan chain SC1 exits physical block 110A at block scan output port 110Ao and enters physical block 120 at block scan input port 120i. After traversing the scan elements of physical block 120, scan chain SC1 exits physical block 120 at block scan output port 120o. Then scan chain SC1 traverses the scan elements in the area of non-block tile 410-2 (See FIG. 6). Finally, scan chain SC1 terminates at scan output pad SOP_1.

Scan Chain SC2 begins at scan input pad SIP_2 and enters physical block 140A at block scan input port 140Ai. After traversing the scan elements of physical block 140A, scan chain SC2 exits physical block 140A at block scan output port 140Ao and enters physical block 110B at block scan input port 110Bi. After traversing the scan elements of physical block 110B, scan chain SC2 exits physical block 110B at block scan output port 110Bo and enters physical block 130 at block scan input port 130i. After traversing the scan elements of physical block 130, scan chain SC2 exits physical block 130 at block scan output port 130o. Scan chain SC2 then traverses the scan elements in the area of non-block tile 420-3 followed by the scan elements of the area of non-block tile 420-4 (See FIG. 6). Scan chain SC2 terminates at scan output pad SOP_2.

Scan Chain SC3 begins at scan input pad SIP_3 and enters physical block 140B at block scan input port 140Bi. After traversing the scan elements of physical block 140B, scan chain SC3 exits physical block 140B at block scan output port 140Bo. Scan chain SC3 then traverses the scan elements in the area of non-block tile 430-1 (See FIG. 6) and terminates at scan output pad SOP_3. Scan Chain SC4 begins at scan input pad SIP_4 and enters physical block 150 at block scan input port 150i. After traversing the scan elements of physical block 150, scan chain SC4 exits physical block 150 at block scan output port 150o and enters physical block 160 at block scan input port 160i. After traversing the scan elements of physical block 160, scan chain SC4 exits physical block 160 at block scan output port 160o and terminates at scan output pad SOP_4.

Thus scan chain planning in accordance with the present invention makes use of physical information with a hierarchical design to better balance the chip level scan chains and to reduce the number of block scan ports. As explained above, rather than producing the actual chip level scan chains, many embodiments of the present invention provide the location of the block scan ports and the number of scan elements in each block scan chain and chip level scan chain. The actual ordering and selection of the scan elements is delayed until the placement of the gates within the physical blocks.

Generally, the present invention is likely to be implemented on a computer as part of an EDA package. The computer programmed in accordance with the invention receives a design of an integrated circuit device, in which locations and size of the logical blocks have been defined. Then, with appropriate parameters from the chip designer, the locations of the block scan ports and the number of scan elements in each block scan chain and chip level scan chain is determined. Other parts of the EDA package can generate the actual scan chains during physical layout of the integrated circuit.

The data structures and software code for implementing one or more acts described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video disks). Computer instruction signals may also be embodied in a transmission medium (with or without a carrier wave upon which the signals are modulated). For example, the transmission medium may include a communications network, such as the Internet.

Numerous modifications and adaptations of the embodiments described herein will become apparent to the skilled artisan in view of this disclosure and are encompassed by the scope of the invention.

What is claimed is:

1. A method of planning chip level scan chains for a hierarchical integrated circuit design having a plurality of physical blocks; a plurality of scan elements, wherein the plurality of scan elements includes a plurality of block scan elements and a plurality of non-block scan elements; and wherein each physical block has a physical block location and the plurality of physical blocks has a plurality of physical block locations, the method comprising:
  collecting the scan elements from the hierarchical integrated circuit design;
  determining a block scan chain size for each of a plurality of block scan chains;
  determining a quantity of chip level block scan chains based on configurable parameters;
  partitioning, by using a computer, the hierarchical integrated circuit design to form a partition for each chip level block scan chain by:
  determining a first scan chain size;
  sorting the plurality of scan elements to form a scan element list;
  parsing scan element on the scan element list to assign scan elements to a first partition;
  placing each parsed non-block scan element in the first partition;
  determining whether all the scan elements of a first physical block containing a parsed block scan element can fit in the first partition;
  assigning the block scan elements of the first physical block to the first partition when the first physical block can fit in the first partition;
  splitting the first physical block when the first physical block can not fit in the first partition; and
  assigning a first subset of the block scan element of the first physical block to the first partition and a second subset of the block scan elements of the first physical block to a second partition;
  determining a block scan port location for each of a plurality of block scan ports to form a plurality of block scan port locations;
  placing block scan elements using the block scan port locations; and
  determining a scan chain path through each partition.

2. The method of claim 1, further comprising assigning each physical block to one or more partitions.

3. The method of claim 2, further comprising tiling each partition based on the physical block locations within each partition.

4. The method of claim 2, further comprising:
  placing a plurality of partition cuts in each partition, wherein the plurality of partition cuts are along borders of the physical blocks within the partitions;
  deriving one or more block tiles based on physical block locations; within each partition; and
  deriving one or more non-block tiles based on the partition cuts in each partition.

5. The method of claim 4, wherein the determining a scan chain path through each partition comprises determining a scan chain path through the block tiles and non-block tiles of each partition.

6. The method of claim 5, wherein each scan chain enters and exits a tile exactly once.

7. A system with a storage medium for planning chip level scan chains for a hierarchical integrated circuit design having a plurality of physical blocks; a plurality of scan elements, wherein the plurality of scan elements includes a plurality of block scan elements and a plurality of non-block scan elements; and wherein each physical block has a physical block location and the plurality of physical blocks has a plurality of physical block locations, the system comprising:
  means for collecting the scan elements from the hierarchical integrated circuit design;
  means for determining a block scan chain size for each of a plurality of block scan chains;
  means for determining a quantity of chip level block scan chains based on configurable parameters;
  means for partitioning the hierarchical integrated circuit design to form a partition for each chip level block scan chain; wherein the means for portioning the hierarchical integrated circuit design include:
  means for determining a first scan chain size;
  means for sorting the plurality of scan elements to form a scan element list;
  means for parsing scan element on the scan element list to assign scan elements to a first partition;
  means for placing each parsed non-block scan element in the first partition;
  means for determining whether all the scan elements of a first physical block containing a parsed block scan element can fit in the first partition;
  means for assigning the block scan elements of the first physical block to the first partition when the first physical block can fit in the first partition;
  means for splitting the first physical block when the first physical block can not fit in the first partitions; and
  means for assigning a first subset of the block scan element of the first physical block to the first partition and a second subset of the block scan elements of the first physical block to a second partition; and
  means for determining a block scan port location for each of the plurality of block scan ports to form a plurality of block scan port locations;
  means for placing block scan elements using the block scan port locations; and
  means for determining a scan chain path through each partition.

8. The system of claim 7, further comprising means for assigning each physical block to one or more partitions.

9. The system of claim 8, further comprising means for tiling each partition based on the physical block locations within each partition.

10. The system of claim 8, further comprising:
  means for placing a plurality of partition cuts in each partition, wherein the plurality of partition cuts are along borders of the physical blocks within the partitions;
  means for deriving one or more block tiles based on physical block locations; within each partition; and
  means for deriving one or more non-block tiles based on the partition cuts in each partition.

11. The system of claim 10, wherein the means for determining a scan chain path through each partition comprises means for determining a scan chain path through the block tiles and non-block tiles of each partition.

12. The system of claim 11, wherein each scan chain enters and exits a tile exactly once.

* * * * *

UNITED STATES PATENT AND TRADEMARK OFFICE
CERTIFICATE OF CORRECTION

PATENT NO. : 7,657,850 B2 Page 1 of 1
APPLICATION NO. : 11/638292
DATED : February 2, 2010
INVENTOR(S) : Huang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 195 days.

Signed and Sealed this

Thirtieth Day of November, 2010

David J. Kappos
*Director of the United States Patent and Trademark Office*